US006705883B1

United States Patent
Ku

(10) Patent No.: US 6,705,883 B1
(45) Date of Patent: Mar. 16, 2004

(54) ELECTRICAL CONNECTOR FOR CONNECTING CPU TO MAIN BOARD

(75) Inventor: Yueh-Chu Ku, Taipei (TW)

(73) Assignee: Egbon Electronics Ltd., Taipei (TW)

( * ) Notice: Subject to any disclaimer, the term of this patent is extended or adjusted under 35 U.S.C. 154(b) by 0 days.

(21) Appl. No.: 10/277,680

(22) Filed: Oct. 23, 2002

(51) Int. Cl.$^7$ ................................................ H01R 4/50
(52) U.S. Cl. ..................................................... 439/342
(58) Field of Search ................................ 439/259, 341, 439/342

(56) References Cited

U.S. PATENT DOCUMENTS

| | | | |
|---|---|---|---|
| 5,167,515 A | * 12/1992 | Matsuoka et al. | 439/342 |
| 5,443,591 A | * 8/1995 | Tsai | 439/342 |
| 5,679,020 A | * 10/1997 | Lai et al. | 439/342 |
| 5,722,848 A | * 3/1998 | Lai et al. | 439/342 |
| 5,833,483 A | * 11/1998 | Lai et al. | 439/342 |
| 6,371,786 B1 | * 4/2002 | Howell et al. | 439/342 |

* cited by examiner

*Primary Examiner*—Javaid H. Nasri
*Assistant Examiner*—Thanh-Tam Le
(74) *Attorney, Agent, or Firm*—Fei-Fei Chao; Venable LLP

(57) ABSTRACT

An electrical connector for electrically connecting a CPU to a main board includes a base covered with a cover. The cover has a periphery defining an indentation therein and is formed with two pairs of tabs extending towards the base. The cover and the base are connected in a manner of allowing the cover to be movable on the base. A rotor is situated between the cover and the base near the periphery of the cover. The rotor has a middle portion and a pair of radial cams. The middle portion is provided with a slot and positioned in the indentation of the cover, and the cams have a profile designed to engage with the tabs of the cover. Therefore, the cover can be moved relative to the base when the rotor is turned by any tool extending into the slot of the middle portion.

1 Claim, 6 Drawing Sheets

ELECTRICAL CONNECTOR FOR CONNECTING CPU TO MAIN BOARD

BACKGROUND OF THE INVENTION

1. Field of the Invention

The present invention relates to an electrical connector and, more particularly, to a compact electrical connector for electrically connecting a CPU to a main board of a computer.

2. Description of Related Art

Computers are now used more and more widely in every field. It is well known that a CPU (Central Processing Unit) in the computer is usually connected to a main board by means of an electrical connector, which typically includes an apertured cover atop a base and, additionally, a driving member for moving the cover. When pins of the CPU are plugged into apertures of the cover, the turning of the driving member may moved the cover relative to the base for a short distance, so that the plugged pins of the CPU are pressed against contacts in the connector.

Referring to FIG. 8, in a conventional connector for such a purpose, the driving member (42) is made in an L-shaped configuration, which includes a crank portion situated between an upper cover (40) and a base (41) and a long-handle portion extending from the crank portion.

Although the cover (40) may be moved relative to the base (41) by turning the long-handle portion of the driving member (42), a problem arises in that the long-handle portion itself occupies much space in the computer. This constant occupation is deemed unnecessary because the long-handle portion is used only when the CPU is connected to or removed from the connection.

Therefore, it is an objective of the invention to provide an electrical connector to mitigate and/or obviate the aforementioned problem.

SUMMARY OF THE INVENTION

The object of the present invention is to provide a compact electrical connector for electrically connecting a CPU to a main board of a computer.

Other objects, advantages and novel features of the invention will become more apparent from the following detailed description when taken in conjunction with the accompanying drawings.

DETAILED DESCRIPTION OF THE PREFERRED EMBODIMENT

Figure 1:
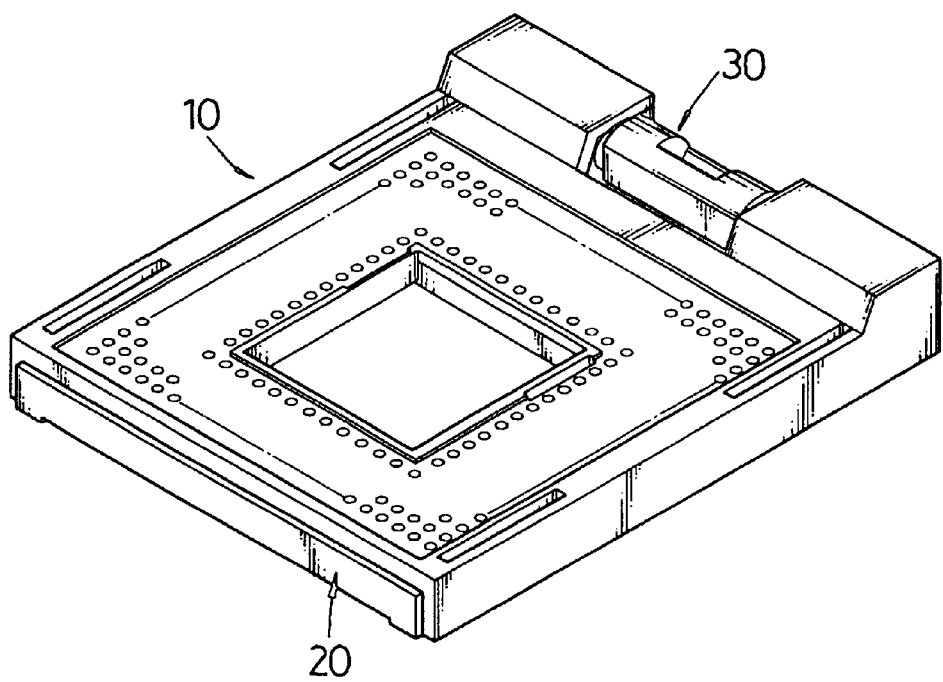
FIG. 1 is a perspective view of a preferred embodiment of an electrical connector in accordance with the present invention.

Referring to FIG. 1, there is shown a preferred embodiment of an electrical connector in accordance with the present invention. The inventive connector includes an upper cover (10) atop a base (20), and a rotor (30) sandwiched between them. The cover (10) and the base (20) are connected in such a manner that the cover (10) is movable on the base (20) in a predetermined direction.

Figure 2:
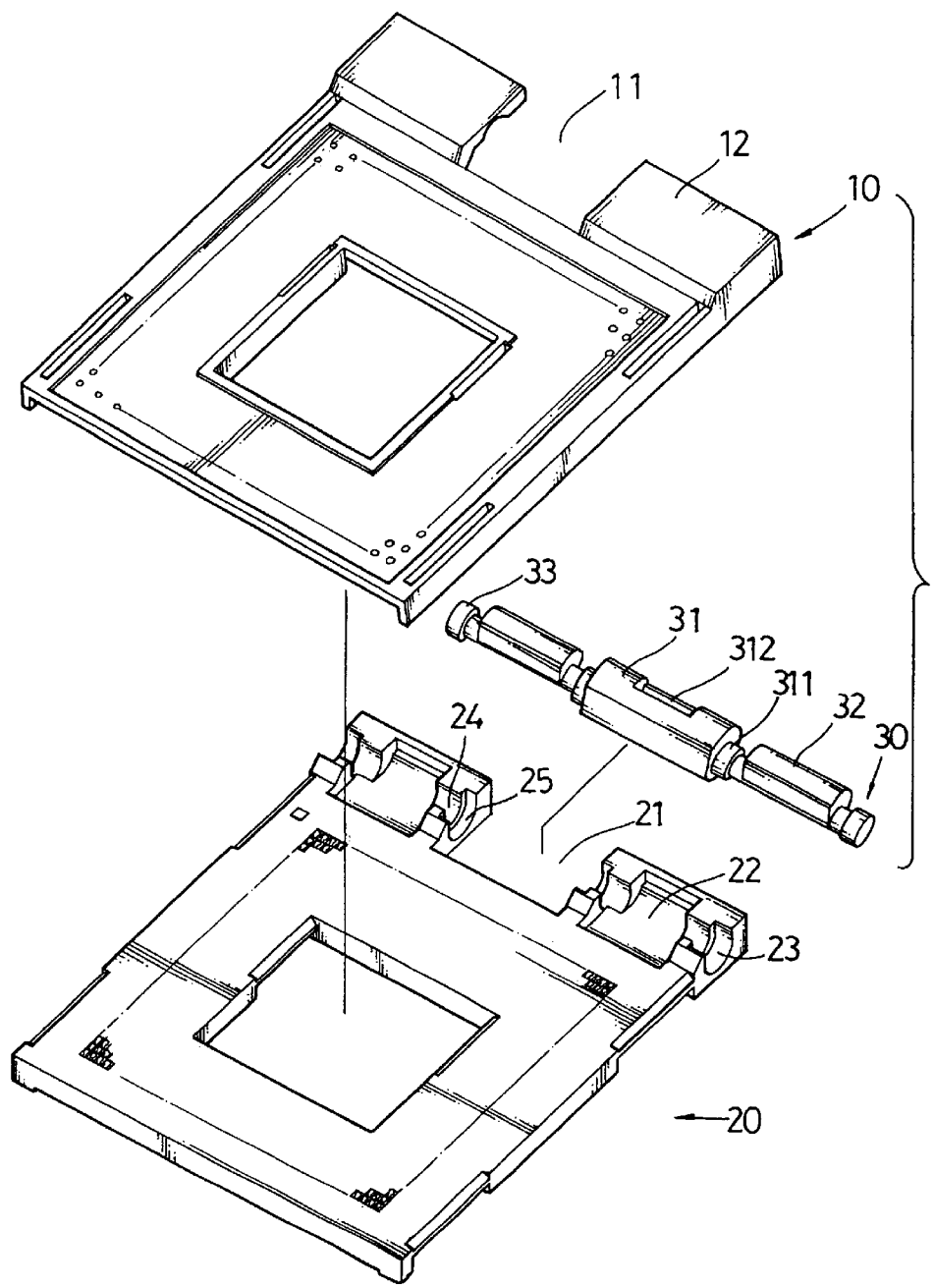
FIG. 2 is an exploded perspective view of the electrical connector of FIG. 1.

Referring to FIG. 2, the cover (10) has a periphery defining an indentation (11) between two protrusions (12). Each of the protrusions (12) is formed with a pair of tabs (13) extending downward towards the base (20), as clearly shown in FIGS. 6 and 7.

The base (20) also includes an indentation (21) defined between two hollow protrusions (22), which each have a pair of opposed bearing surfaces (24) for rotatably supporting the rotor (30). Optionally, each hollow protrusion (22) is additionally formed with an outer recess (23) and an inner recess (25) at sides thereof.

Figure 3:
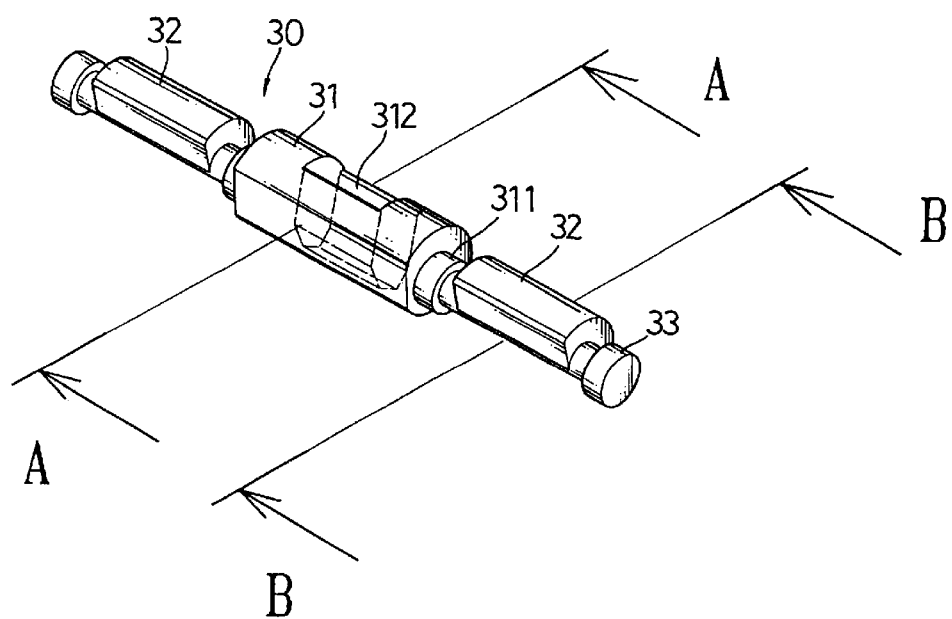
FIG. 3 is a perspective view of a rotor included in the electrical connector of FIG. 1.
Figure 4:
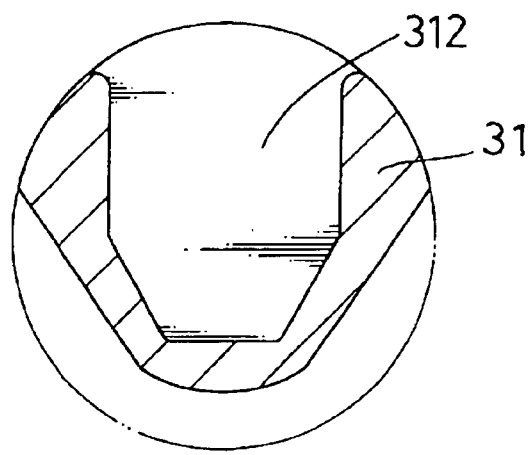
FIG. 4 is a cross-sectional view of the rotor taken along lines A—A in FIG. 3.
Figure 5:
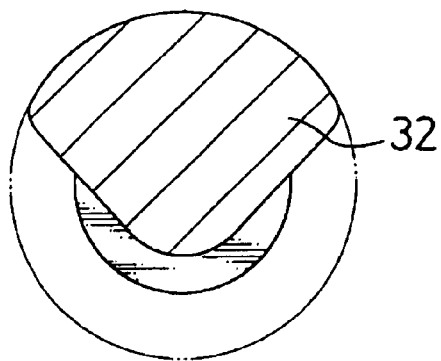
FIG. 5 is a cross-sectional view of the rotor taken along lines B—B in FIG. 3.

Referring to FIGS. 2 and 3, the rotor (30) has a middle portion (31) intervening between a pair of radial cams (32), each eccentric to the rotor (30) as best shown in FIGS. 4 and 5. Furthermore, the middle portion (31) has a slot (312) defined therein and, optionally, the rotor (30) may be formed with a pair of enlarged ends (33) and two collars (311) on both sides of the portion (31).

The rotor (30) is situated between the cover (10) and the base (20) on the bearing surfaces (24), with the middle portion (31) positioned in the indentations (11, 21) and with the radial cams (32) contained in the hollow protrusions (22). The enlarged ends (33) of the rotor (30) are snugly received in the outer recesses (23) of the protrusions (22) and the collars (311) are snugly received in the inner recesses (25), for the purpose of rotatably supporting rotor (30), as well as for preventing the same rotor (30) from moving axially relative to base (20).

Figure 6:
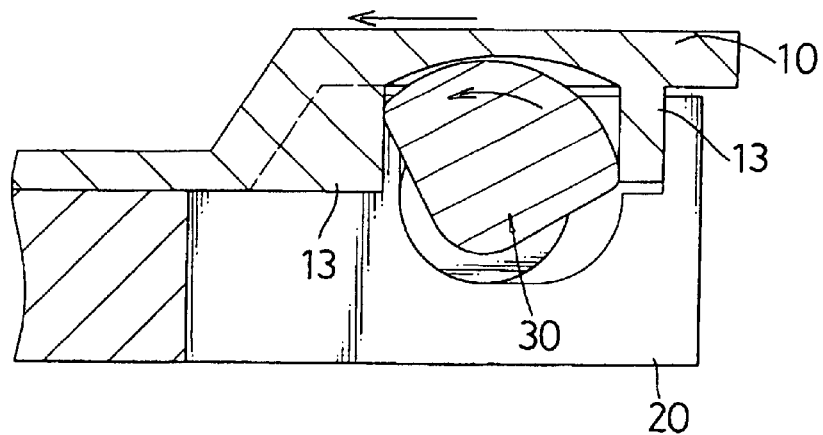
FIG. 6 is a cross-sectional view of the electrical connector of FIG. 1, showing a cover in an original position relative to a base.
Figure 7:
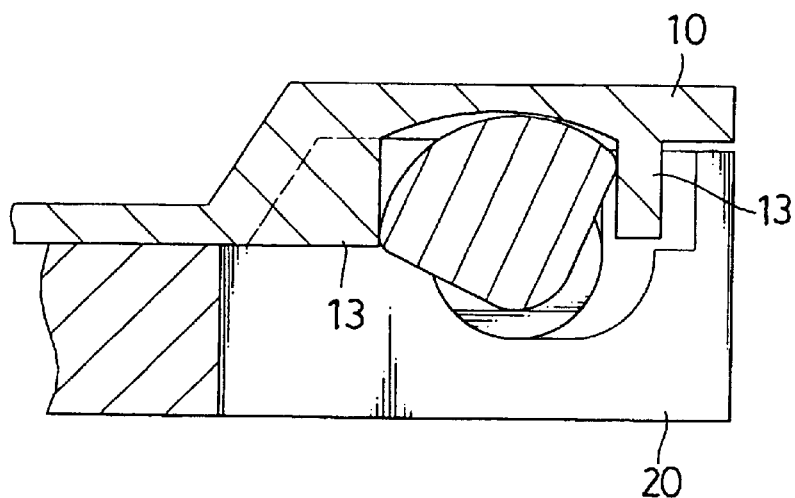
FIG. 7 is a cross-sectional view of the electrical connector of FIG. 1, showing the cover in a displaced position relative to the base.
Figure 8:
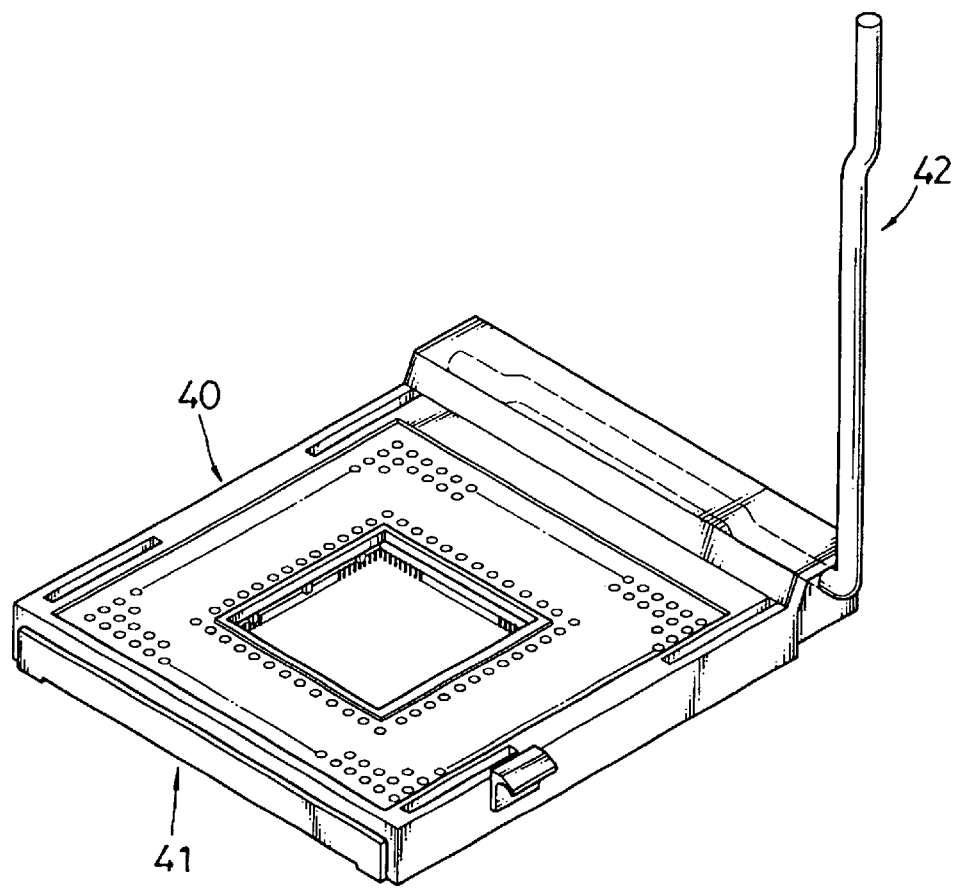
FIG. 8 is a perspective view of a conventional electrical connector for such a purpose.

Referring to FIGS. 1, 6 and 7, each radial cam (32) of the rotor (30) has a profile designed to push the downwardly-extending tabs (13) of the cover (10). As a result, the cover (10) can be moved relative to the base (20) from a position, as shown in FIG. 6, to another position, as shown in FIG. 7, when the rotor (30) is turned by any tool, such as a screwdriver, that extends into the slot (312) of the middle portion (31). It is conceivable that the resulting displacement will press plugged pins of a CPU against related contacts inside the inventive connector.

From the above description, it is noted that the invention has the advantage of being compact in structure, due to the fact that no handle is involved in its rotors.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:

a base (20);

a cover (10) atop said base (20), said cover (10) having a periphery defining an indentation (11) therein and being formed with two pairs of tabs (13) extending towards said base (20);

said cover (10) and said base (20) being connected in a manner of allowing said cover (10) to be movable on said base (20);

a rotor (30) situated between said cover (10) and said base (20) near said periphery of said cover (10), said rotor (30) having a middle portion (31) and a pair of radial cams (32) at sides of said middle portion (31); and said middle portion (31) being provided with a slot (312) and positioned in said indentation (11) of said cover (10), said cams (32) having a profile designed to engage with said tabs (13) of said cover (10);

wherein said rotor (30) has a pair of enlarged ends (33) and two collars (311) that are formed on both sides of the middle portion (31), wherein said base (20) is defined with respective outer recesses (23) and inner recesses (25) for respectively and snugly receiving said enlarged ends (33) and said collars (311);

whereby said cover (10) can be moved relative to said base (20) when said rotor (30) is turned by any tool extending into said slot (312) of said middle portion (31).

* * * * *